(12) United States Patent
Takamura et al.

(10) Patent No.: US 8,556,459 B2
(45) Date of Patent: Oct. 15, 2013

(54) LIGHTING DEVICE HAVING SURFACE LIGHT SOURCE PANELS

(75) Inventors: Makoto Takamura, Kyoto (JP); Masashi Tanaka, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 181 days.

(21) Appl. No.: 12/681,033

(22) PCT Filed: Sep. 12, 2008

(86) PCT No.: PCT/JP2008/066520
§ 371 (c)(1),
(2), (4) Date: Jul. 23, 2010

(87) PCT Pub. No.: WO2009/044616
PCT Pub. Date: Apr. 9, 2009

(65) Prior Publication Data
US 2010/0328943 A1    Dec. 30, 2010

(30) Foreign Application Priority Data

Oct. 1, 2007 (JP) ................. P2007-258026

(51) Int. Cl.
*F21V 1/00* (2006.01)
*F21V 11/00* (2006.01)
(52) U.S. Cl.
USPC ............. 362/238; 362/249.08; 362/249.09; 362/239
(58) Field of Classification Search
USPC .......... 257/98; 362/235, 237, 249.04, 249.08, 362/249.1, 238, 239, 241
See application file for complete search history.

(56) References Cited

U.S. PATENT DOCUMENTS

| | | | | |
|---|---|---|---|---|
| 5,833,358 A | * | 11/1998 | Patik | 362/391 |
| 6,371,637 B1 | * | 4/2002 | Atchinson et al. | 362/555 |
| 7,592,276 B2 | * | 9/2009 | Hill et al. | 442/301 |
| 7,600,894 B1 | * | 10/2009 | Simon | 362/244 |

(Continued)

FOREIGN PATENT DOCUMENTS

| | | |
|---|---|---|
| JP | S54-02187 | 2/1979 |
| JP | 2003-215350 A | 7/2003 |
| JP | 2005-038661 A | 2/2005 |
| JP | 2006-210119 A | 8/2006 |

OTHER PUBLICATIONS

Machine English Translation of JP2006-210119, Light Emitting Device, Publication Date Oct. 8, 2006.*

*Primary Examiner* — Mariceli Santiago
*Assistant Examiner* — Glenn Zimmerman
(74) *Attorney, Agent, or Firm* — Rabin & Berdo, P.C.

(57) ABSTRACT

Provided is a lighting device having high luminance in-plane uniformity without a dark part occurring at a connecting part between surface light source panels.

The lighting device (1) is provided with a plurality of surface light source panel (2), and a plurality of light diffusion passive reflectors (3) disposed at the light-emitting side of the surface light source panel (2). In the light diffusion passive reflector (3), a rectangular-shaped bottom surface is disposed on a light emitting region of the surface light source panel (2), and a light-emitting surface (3a) has substantially the same size as a planar outline of the surface light source panel (2), and a side surface (3c) is formed to incline diagonally outward towards the light-emitting surface (3a) from the bottom surface. The light diffusion passive reflectors (3) which are mutually adjoining are disposed to contact with each other without a gap in between, and are disposed so that the light-emitting surface (3a) is continuously arranged.

6 Claims, 8 Drawing Sheets

(56) References Cited

U.S. PATENT DOCUMENTS

| | | |
|---|---|---|
| 2004/0012957 A1* | 1/2004 | Bachl et al. .................. 362/241 |
| 2005/0269578 A1* | 12/2005 | Barnes et al. .................. 257/81 |
| 2006/0145170 A1* | 7/2006 | Cho ................................ 257/95 |
| 2007/0035969 A1* | 2/2007 | Kaneko et al. ................ 362/633 |
| 2008/0225523 A1* | 9/2008 | De Samber et al. .......... 362/249 |

* cited by examiner (a)

LIGHT EMITTING AREA (b)

(a)

(b)

(a)

(b)

120
LIGHTING DEVICE HAVING SURFACE LIGHT SOURCE PANELS

TECHNICAL FIELD

The present invention relates to a lighting device. More particularly, the present invention relates to a lighting device having a plurality of surface light source panels.

BACKGROUND ART

Conventionally, a surface light source panel (lighting device) as shown in FIG. 1(a) is known (for example, refer to Patent Literature 1). As for such a surface light source panel 100, a layered structure (not shown) of an anode, an organic electroluminescence layer and a cathode intervenes between a transparent substrate 101 and a sealing substrate 102. Moreover, a sealing member 103 is formed to surround internal space between the edge parts of the transparent substrate 101 and the sealing substrate 102.

In recent years, as shown in FIG. 1(b), an effort to produce a pseudo-large-sized lighting device 110 is performed by arranging a plurality of comparatively small surface light source panels 100 in two dimensions. Thus, the reason for producing by using the plurality of surface light source panels 100 is that it takes into consideration for the manufacturing yield of the surface light source panel 100. That is, it is because the rate which becomes a defective product including a defect in proportion to size will increase and the yield will worsen, when producing a large-sized lighting device by using a single surface light source panel 100.

[Patent Literature 1] Japanese Patent Application Laying-Open Publication No. 2005-38661

DISCLOSURE OF INVENTION

Technical Problem

However, when the large-sized lighting device 110 is produced by arranging a plurality of surface light source panels 100 in two dimensions, there are problems which will be explained hereinafter.

That is, since the sealing member 103 is formed in frame shape to surround the light emitting region 104 in each surface light source panel 100 as shown in FIG. 1(a), a sealing area 105 formed of the sealing member 103 exists as a region which does not emit light, naturally. As shown in FIG. 1(b), since a boundary (connecting part) between the surface light source panels 100 which are mutually adjoining, the sealing area 105 located at the periphery of the lighting device 110, etc. are darkly conspicuous, it was difficult to produce the large-sized lighting device 110 for achieving surface light uniformly. In particular, there was a problem that a wide dark part will be formed, since the sealing areas 105 of both surface light source panels 100 are mutually adjoining on the boundary between the surface light source panels 100.

Moreover, when the large-sized lighting device 110 is produced by arranging a plurality of surface light source panels 100 in two dimensions, it is requested for having a function which can be bent or curved on the light-emitting surface. However, there was a problem that the dark part of boundary part and peripheral edge part between the surface light source panels 100 is conspicuous since the sealing area 105 exists as well as the above-mentioned lighting device 110, and it was difficult to utilize until the problem that a gap occurs between the surface light source panels 100 by being bent or curved is solved.

The principal purpose of the present invention is to provide a lighting device having high luminance in-plane uniformity, without a dark part occurring at a connecting part between surface light source panels.

Moreover, another purpose of the present invention is to provide a lighting device which can be bent or curved and also a dark part does not occur at a boundary part, etc. between surface light source panels.

Solution to Problem

Then, in the characteristic of the present invention, the summary is to comprising: a plurality of surface light source panels disposed to be mutually adjoining in two dimensions; and a plurality of light diffusion passive reflectors including a side surface and a light-emitting surface, a bottom surface being disposed on a surface of a light emitting region in each the surface light source panel, the side surface acting as a reflection mirror surface formed to incline towards a diagonal outside at a side of a light-emitting direction from the bottom surface, the light-emitting surface emitting an emitted light from the light emitting region and a reflected light from the side surface, a plurality of the light diffusion passive reflectors being disposed to be mutually adjoining without a gap in between and to form a continuous face.

In this case, as for the light diffusion passive reflector, it is preferred that a part located outside of an outline at the bottom surface of the light diffusion passive reflector is transparent. Thus, by making transparent the part of the light diffusion passive reflector located at the outside of an outline at the bottom, i.e., the outside of the light emitting region, the amount of light-emitting in the region which is not emitting light outside of the light emitting region can be decreased, and the luminance in-plane uniformity of the lighting device can be further improved.

Moreover, it is effective also as a configuration that a part located outside of an outline at the bottom surface of the light diffusion passive reflector is transparent. According to such a configuration, a curved light-emitting surface can be achieved as the lighting device, and it is possible to generate a light effect corresponding to the surrounding environment.

Furthermore, a plurality of the surface light source panels may be disposed to be mutually adjoining in two dimensions, may be provided along with a plurality of electrode plates mutually connected so that curvature is possible, and can be curved at a boundary part corresponding to the curvature of the electrode plate.

Moreover, it is effective also as a configuration that the surface light source panels adjoining mutually is connected with each other by supporting a free end of a pair of universal links rotatably at a backside, respectively, and is abutted on an edge part between the light diffusion passive reflectors in the state to be curved mutually.

Furthermore, it is preferred that the light-emitting surface of the light diffusion passive reflector has light diffusion structure. Accordingly, since the light is diffused on the light-emitting surface when the light from the light emitting region and the reflected light from the side surface reach the light-emitting surface, the visual angle dependency of luminance and chromaticity can be reduced, and the angle of visibility can be decreased. As the light diffusion structure, for example, it may be suitable for a roughened surface formed by performing the surface roughening of the light-emitting surface, and may be suitable for a structure formed by bonding the light diffusing films each other.

Advantageous Effects of Invention

According to the present invention, since the light is guided from the light emitting region side to the part located on the non-light emitting region of the surface light source panel in the light diffusion passive reflector, the luminance in-plane uniformity can be improved as the whole lighting device.

In particular, according to the present invention, since it can suppress that the dark part occurs at the boundary part between the surface light source panels even if the surface light source panels are disposed in two dimensions without limitation of a number, it becomes possible to build the lighting device composed of the optically unified large-sized surface light source.

(a) A perspective diagram of a surface light source panel, and (b) A reference drawing showing a state where the surface light source panels are made to array in two dimensions.

Figure 2:
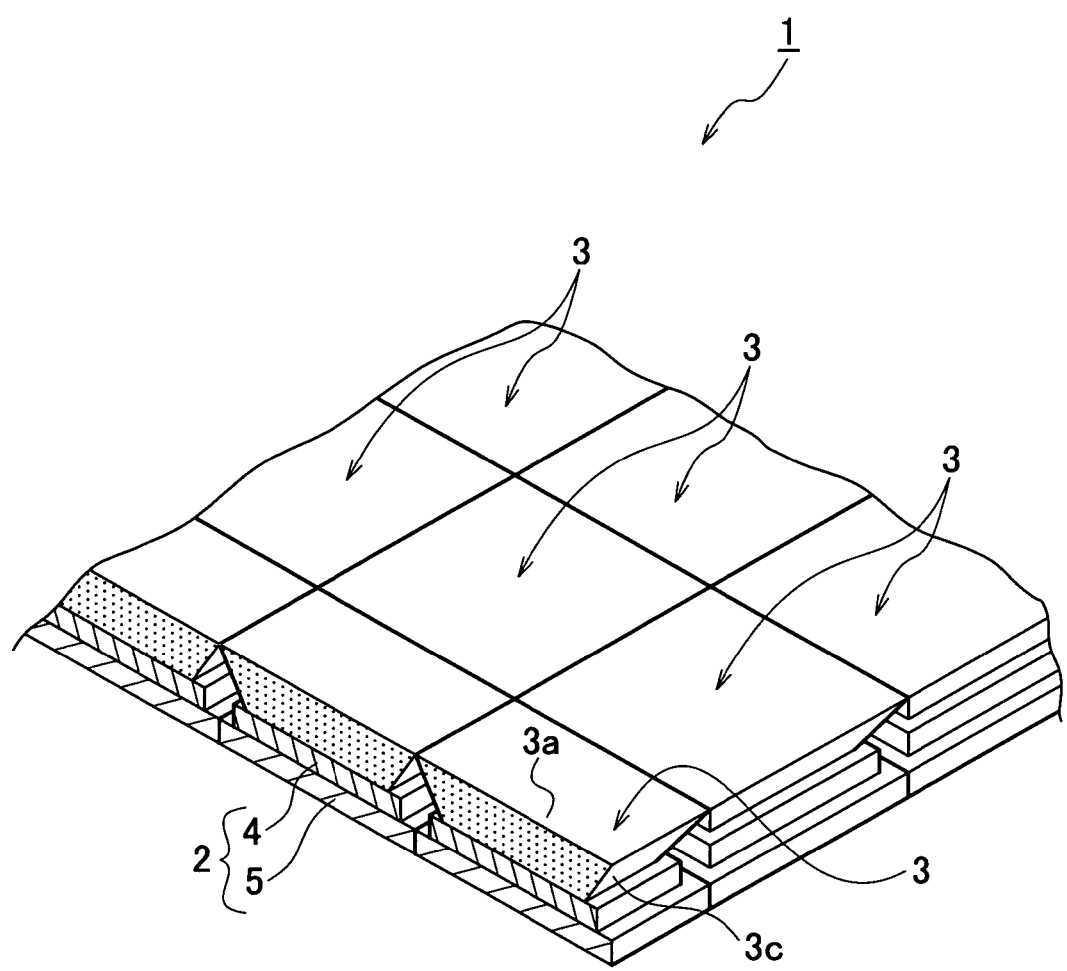

FIG. 2 It is a feature perspective diagram of a lighting device according to a first embodiment of the present invention.

FIG. 3

(a) A sectional view of a surface light source panel and a light diffusion passive reflector which are units composing the lighting device according to the first embodiment of the present invention, and (b) A plan view of a part attached of the surface light source panel and the light diffusion passive reflector which are the units composing the lighting device.

FIG. 4

(a) A sectional view, and (b) A plan view, showing a modified example of a light diffusion passive reflector in the first embodiment.

Figure 5:
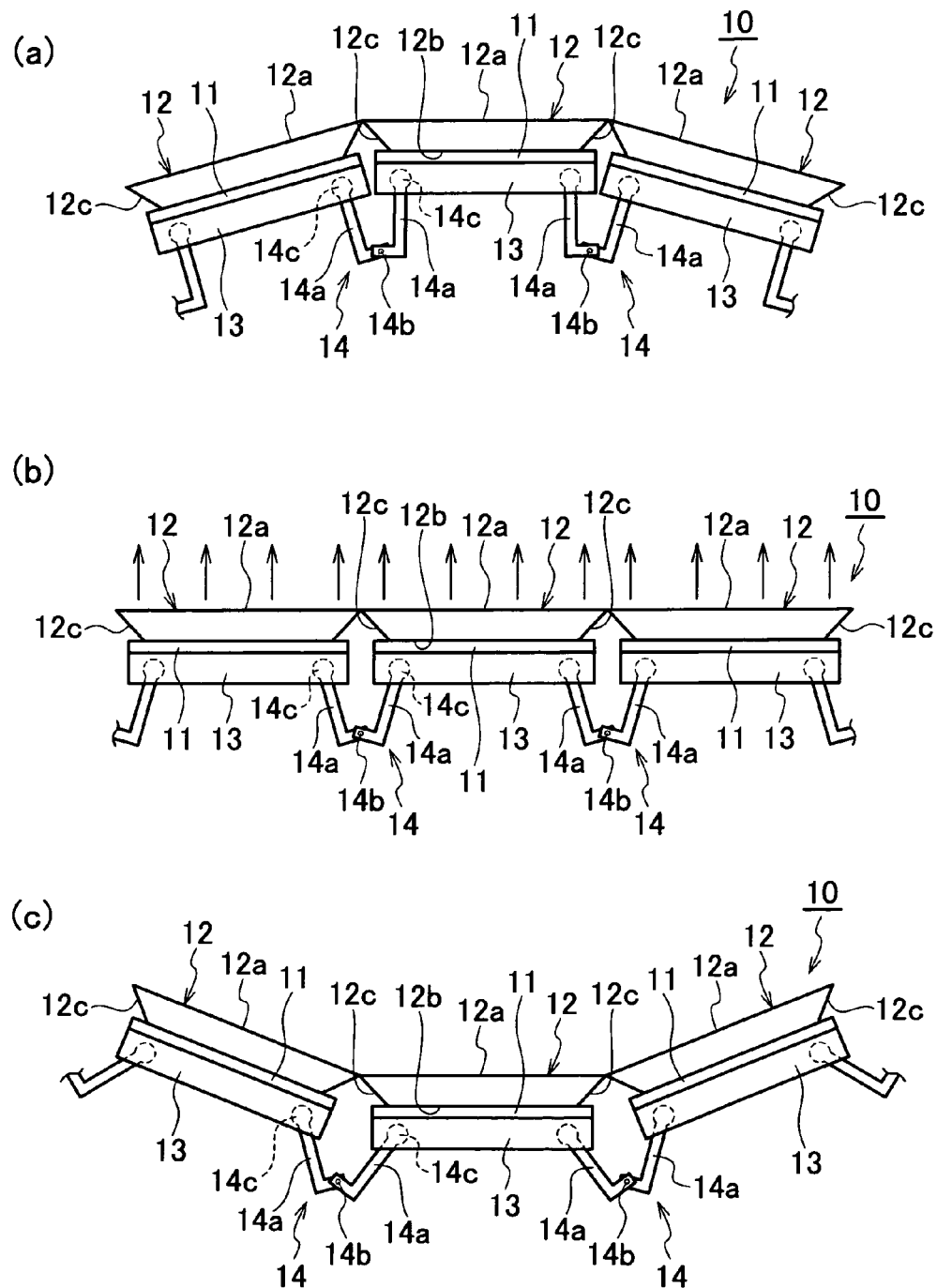

FIG. 5 (a) to (c) are explanatory diagrams of a lighting device according to a second embodiment of the present invention, (a) shows a state where a continuous light-emitting surface forms a convex, (b) shows a state where the continuous light-emitting surface forms a plane, and (c) shows a state where the continuous light-emitting surface forms a concave.

Figure 6:
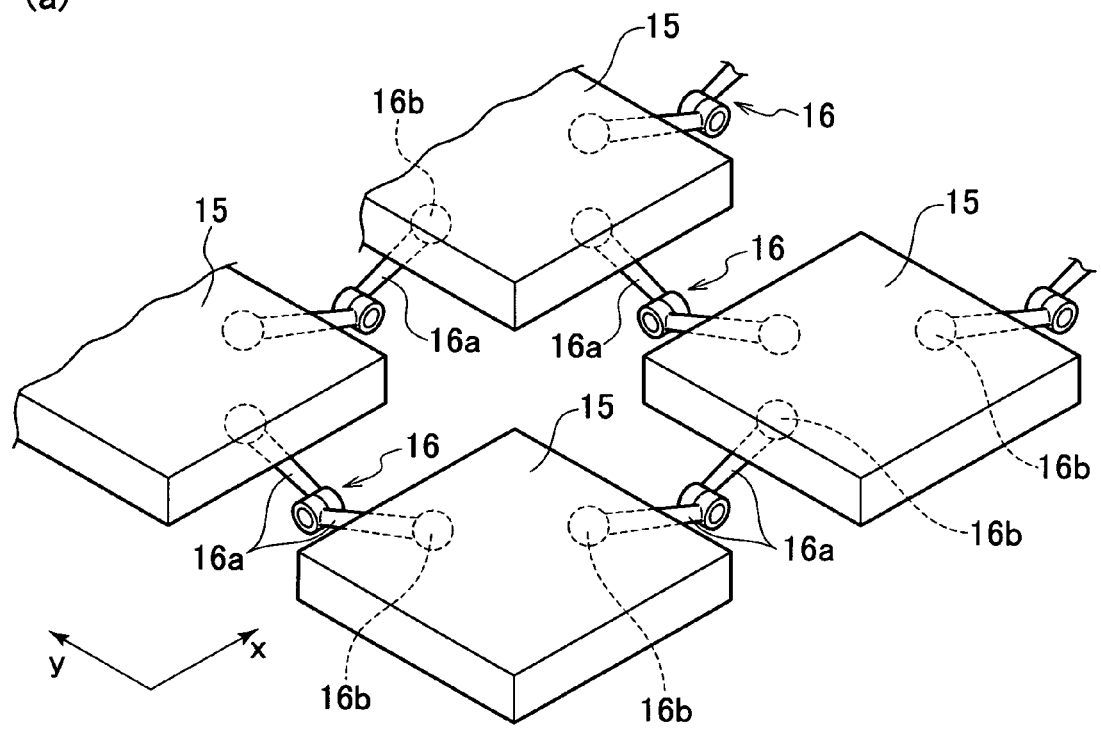
Figure 6:
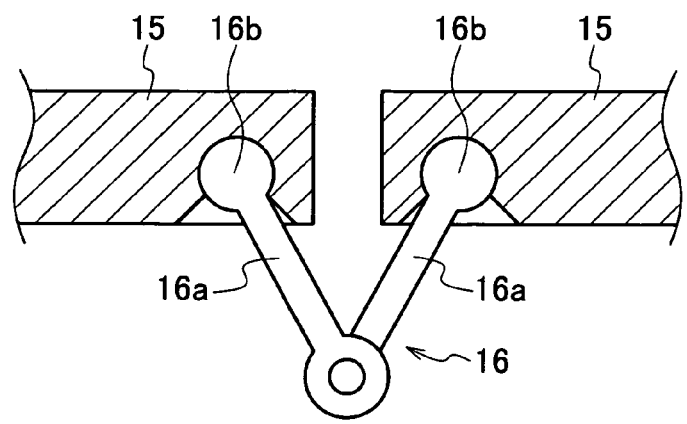

FIG. 6 (a) A perspective diagram, and (b) A feature sectional view, showing a modified example 1 of a connecting structure of the second embodiment.

Figure 7:
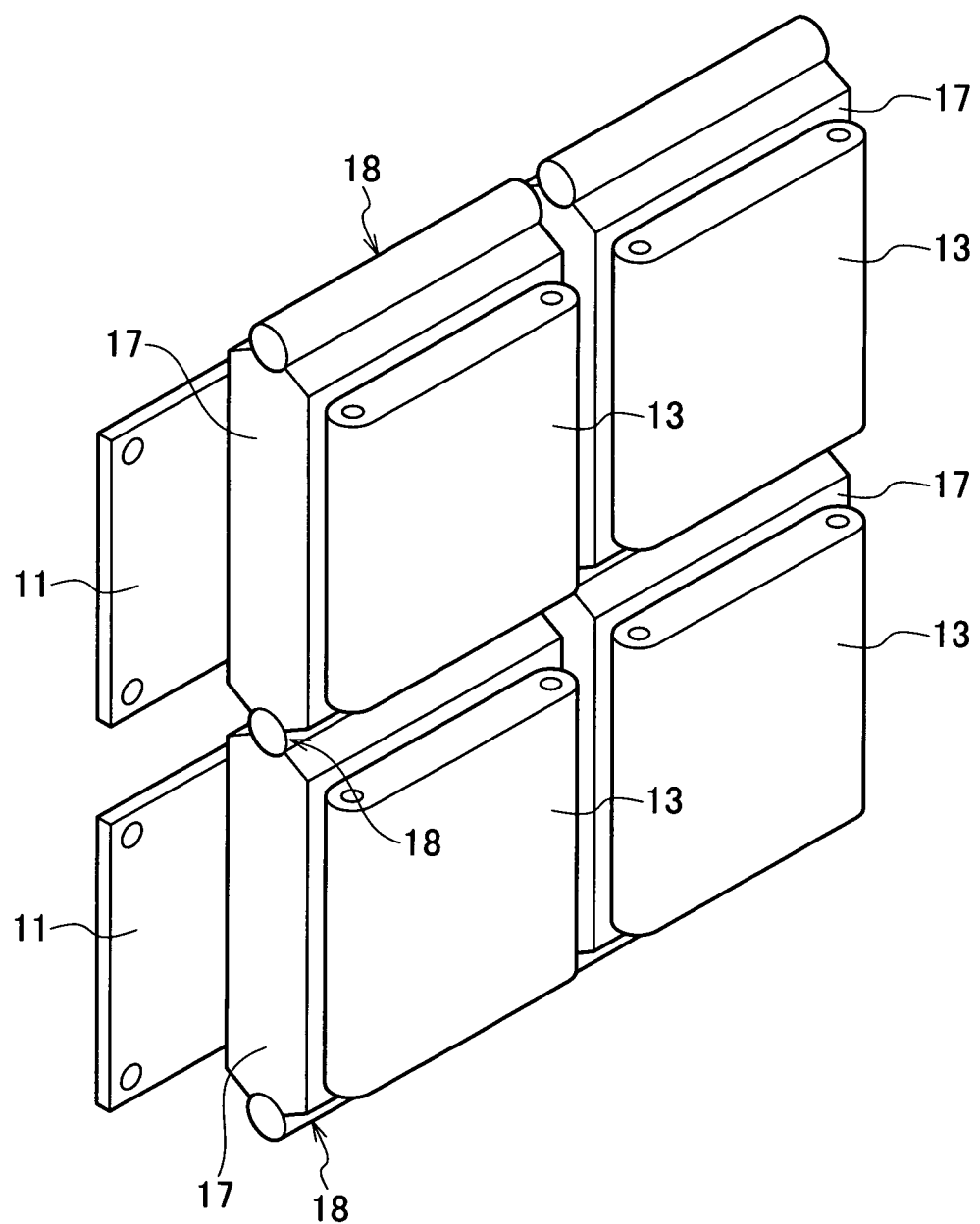

FIG. 7 It is a perspective diagram showing a modified example 2 of the connecting structure according to the second embodiment.

Figure 8:
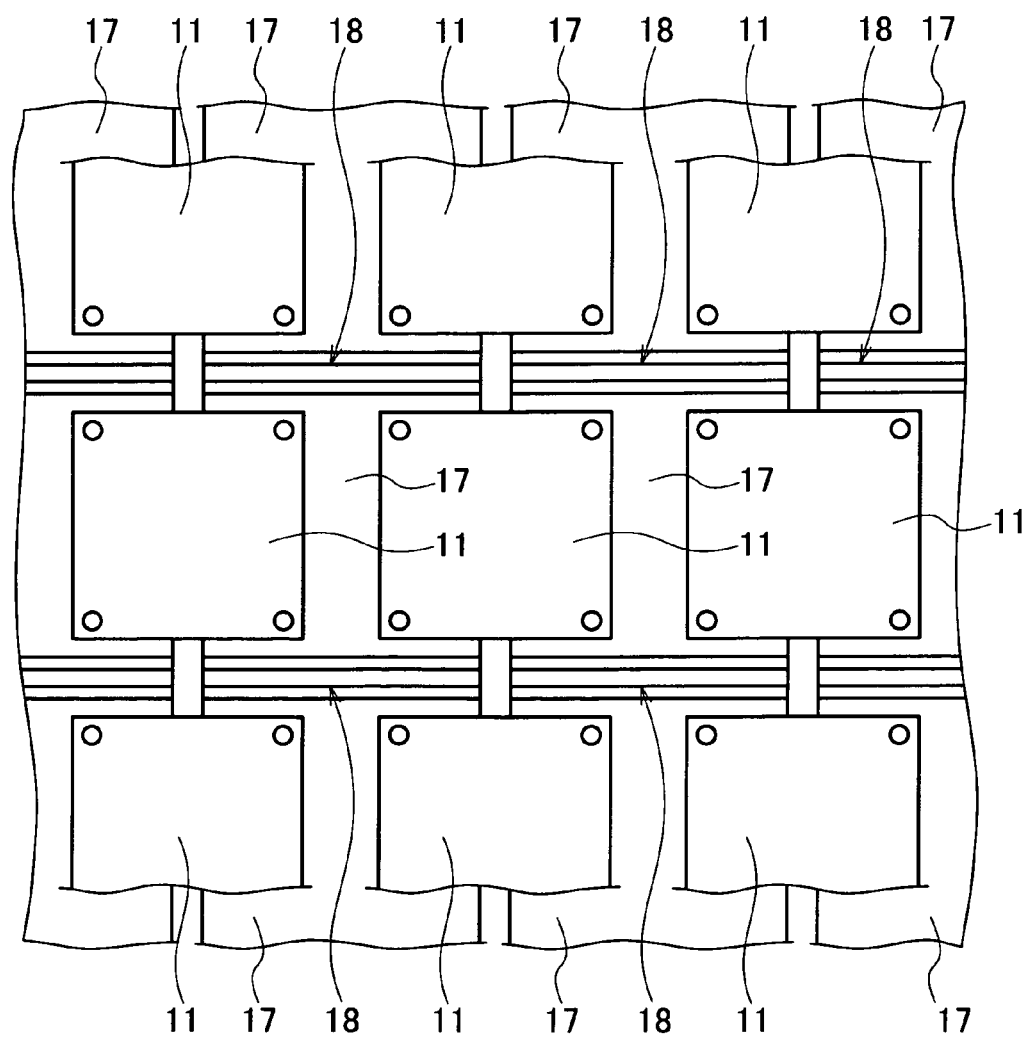

FIG. 8 It is a plan view showing the modified example 2 of the connecting structure according to the second embodiment.

REFERENCE SIGNS LIST

A1: Light emitting region;
A2: Non-light emitting region;
1: Lighting device;
2: Surface light source panel;
3: Light diffusion passive reflector;
3a: Light-emitting surface;
3b: Bottom surface;
3c: Side surface (reflection mirror surface);
3d: Transparent area;
4: Transparent substrate;
5: Sealing substrate;
10: Lighting device;
11: Surface light source panel;
12: Light diffusion passive reflector;
12a: Light-emitting surface;
12b: Bottom surface;
12c: Side surface (reflection mirror surface);
13: Heat sink plate;
14, 16: Universal link;
15: Base plate; and
18: Hinge region.

BEST MODE FOR CARRYING OUT THE INVENTION

Hereinafter, the details of lighting devices according to embodiments of the present invention will be explained based on drawings.

[First Embodiment]

Figure 3:
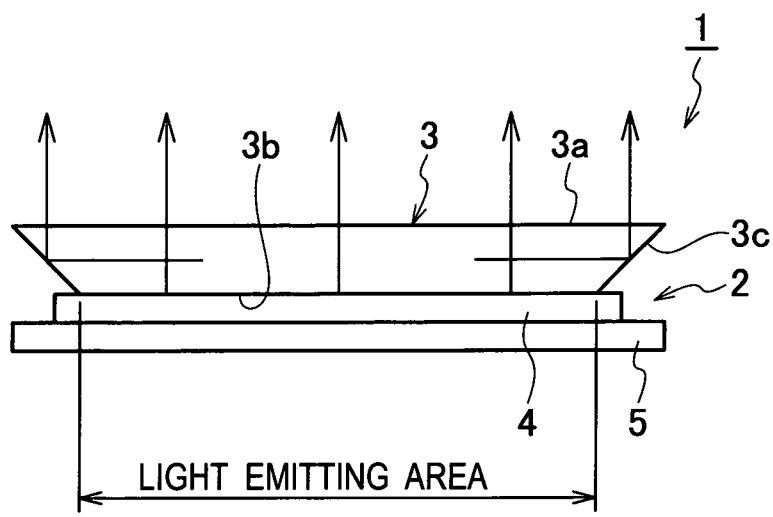
Figure 3:
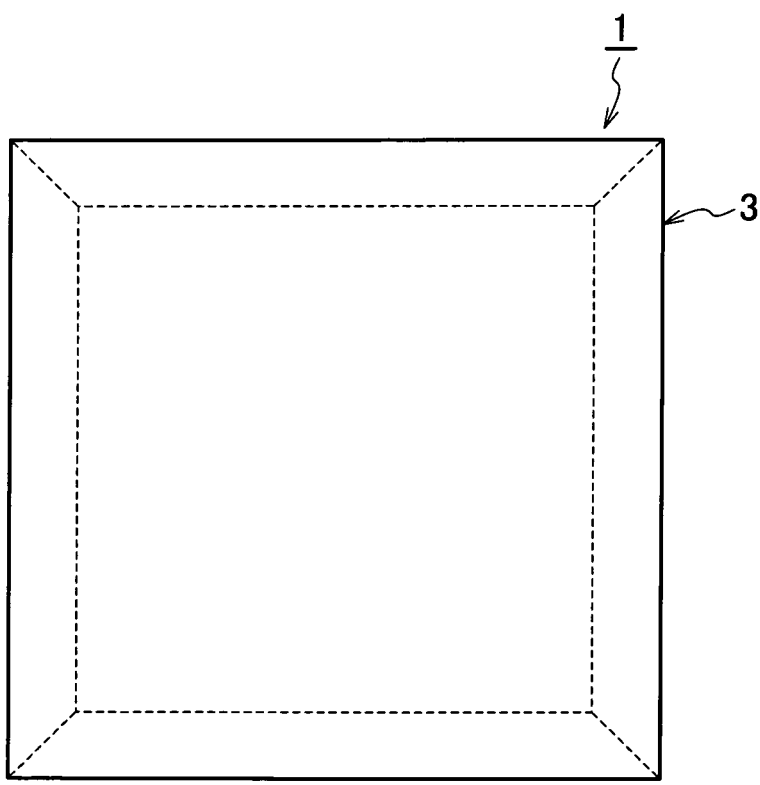

A lighting device 1 according to a first embodiment of the present invention will be explained using FIG. 2 and FIG. 3.

(Schematic Structure of Lighting Device)

As shown in FIG. 2, the lighting device 1 according to the present embodiment is substantially composed by including a plurality of surface light source panels 2, and a plurality of light diffusion passive reflectors 3 disposed at the light-emitting side of the surface light source panel 2.

(Configuration of Surface Light Source Panel)

Figure 1:
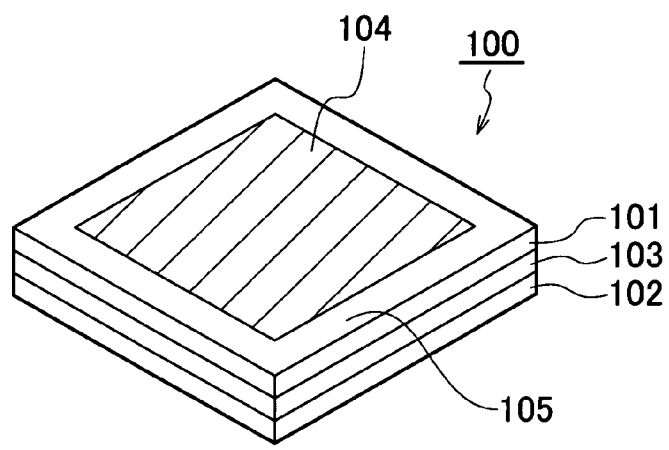
FIG. 1
Figure 1:
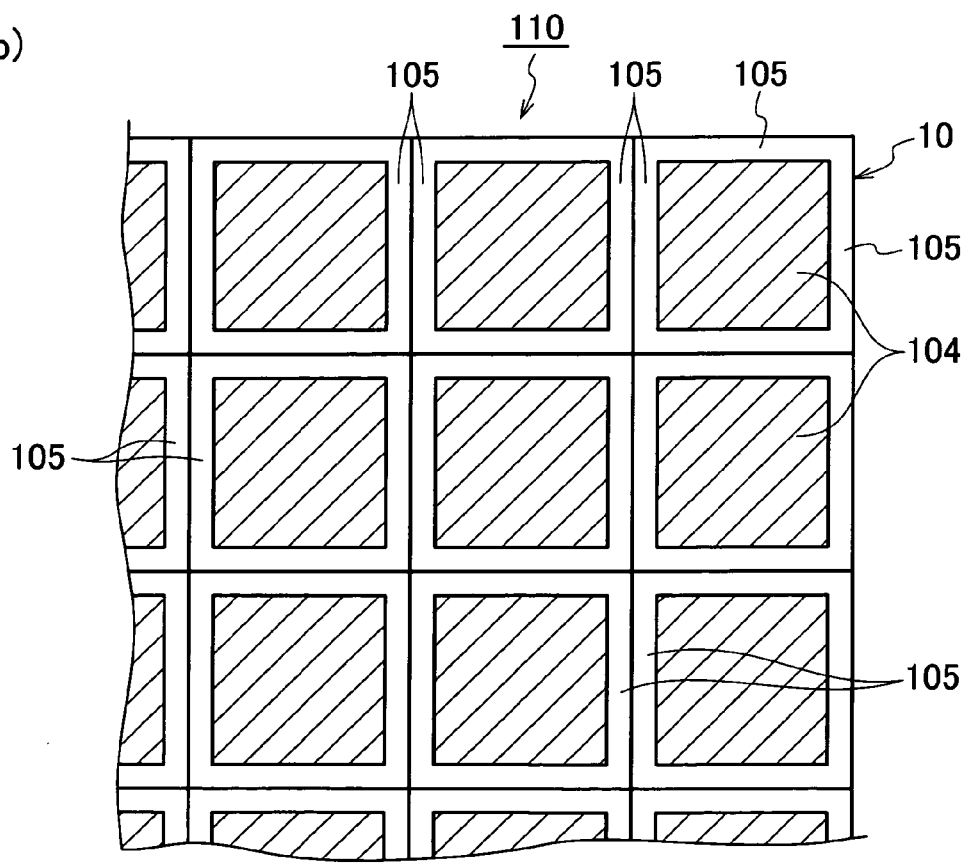

In the surface light source panel 2, layered structure (not shown), such as an anode, an organic electroluminescence layer and a cathode, intervenes between a transparent substrate and a sealing substrate 5 of rectangular shape having substantially the same size, respectively. Moreover, a sealing member (not shown) is provided to surround internal space between the edge parts of the transparent substrate 4 and the sealing substrate 5. In addition, the configuration of the surface light source panel 2 according to the present embodiment is the same configuration as the surface light source panel shown in FIG. 1(a). Moreover, as shown in FIG. 2, the surface light source panels 2 are disposed and fixed on a supporting substrate (not shown) so that a gap does not occur vertically and horizontally in two dimensions.

(Configuration of Light Diffusion Passive Reflector)

The light diffusion passive reflector 3 composes an acrylic board having a light diffusing function, for example. As shown in FIG. 3(a) and FIG. 3(b), the structure of the light diffusion passive reflector 3 is a trapezoidal shaped plate structure with the larger size of a light-emitting surface 3a than the size of a bottom surface 3b. More specifically, the bottom surface 3b of rectangular shape is set as the same size as the light emitting region A1 of the surface light source panel 2 to conform with the light emitting region A1, or is set up a little more largely to cover the light emitting region A1 completely. Moreover, the light-emitting surface 3a which is parallel to the bottom surface 3b has substantially the same size as the planar outline of the surface light source panel 2 as shown in FIG. 3(a), and is set up so that the outline of the light-emitting surface 3a overlaps with the surface light source panel 2 substantially as shown in FIG. 3(b) when observed from the plan surface. A side surface 3c between the sides corresponding to the light-emitting surface 3a and the bottom surface 3b, respectively is formed to incline diagonally outward from the bottom surface 3b towards the light-emitting surface 3a. That is, as shown in FIG. 3(a), the edge part of the light diffusion passive reflector 3 is formed to be overhang-shaped. In the present embodiment, the angle θ between the side surface 3c and the surface of the surface light source panel 2 is set up in the range of 45±10 degrees In addition, what is necessary is just to optimize arbitrarily the raise degree of this light diffusion passive reflector 3 depending on the size and the level to diffuse of the surface light source panel 2, and the emitted light intensity from the surface light source panel 2 side, etc. In addition, the light diffusion passive reflector 3 is preferable to be formed by resin, such as acrylic, as mentioned above, but it is also possible to use a glass etc. having a light diffusing function which is cloudy on the inside.

As mentioned above, a plurality of surface light source panel 2 is disposed and fixed on the supporting substrate (not shown) each other so that a gap may not occur vertically and horizontally in two dimensions in between. Therefore, as shown in FIG. 2, the light diffusion passive reflector 3 disposed on the surface light source panel 2 is also disposed to be mutually adjoining so that a gap does not occur vertically and horizontally.

(Operation of Lighting Device)

When each surface light source panel 2 composing the lighting device 1 is driven, light is emitted from the light emitting region A1 of the surface light source panel 2 to the light diffusion passive reflector 3 side. In the light diffusion passive reflector 3, light is diffused to a part located just above the light emitting region A1. It is the same even when the light diffusion passive reflector which does not have the inclining side surface 3c is used.

As shown in FIG. 3(a), since the non-light emitting region A2 of the surface light source panel 2 originally does not emit light, the non-light emitting region A2 is a region which is a dark part if the light diffusion passive reflector 3 is not formed. However, in the present embodiment, since the side surface 3c of the light diffusion passive reflector 3 is disposed correspond to the non-light emitting region A2, the light which is diffused within the light diffusion passive reflector 3 and travels to the side surface 3c, and the light which travels to the side surface 3c directly from the light emitting region A1 are reflected on the light-emitting surface 3a side because the side surface 3c functions as a reflection mirror. Thus, since the light is also emitted from the light-emitting surface 3a on the non-light emitting region A2 of the boundary part between the surface light source panels 2, the non-light emitting region A2 is not recognized visually as a dark part. It becomes possible to set the regions correspond to the light emitting region A1 and the non-light emitting region A2 in the light-emitting surface 3a as equivalent luminance each other, by calibrating the angle of gradient θ of the side surface 3c of the light diffusion passive reflector 3, and compounding of diffusing function particles etc.

In the above, the configuration of the lighting device 1 according to the first embodiment has been explained. Such a lighting device 1 has one optically unified light-emitting surface without a connecting part in appearance using a plurality of surface light source panels 2.

As for the surface light source panel 2, the defect increases and the yield deteriorates in proportion to the emission area. However, in the present embodiment, the large-sized lighting device 1 having high luminance in-plane uniformity can be achieved by using a plurality of small-sized surface light source panels 2 having satisfactory yield.

Since the connecting part between the surface light source panels 2 does not act as a dark part when the lighting device 1 according to the present embodiment is used, for example as a backlight of a liquid crystal display device, the high quality liquid crystal display device is achievable.

In addition, although the example which used organic electroluminescence material for the surface light source panel 2 has been explained in the present embodiment, it is not limited to the above-mentioned configuration if it is the material which performs surface light emission. There is the surface light source panel which used an inorganic electroluminescence material other than the organic electroluminescence material, for example.

(Modified Example of Light Diffusion Passive Reflector)

Figure 4:
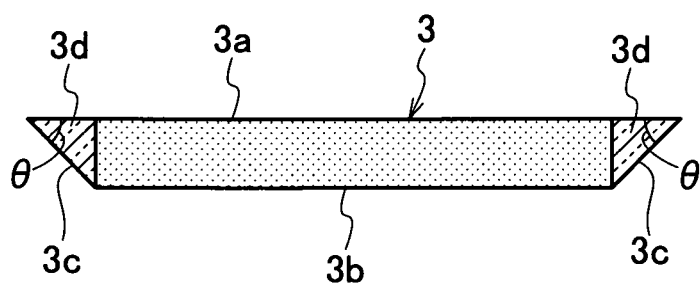
Figure 4:
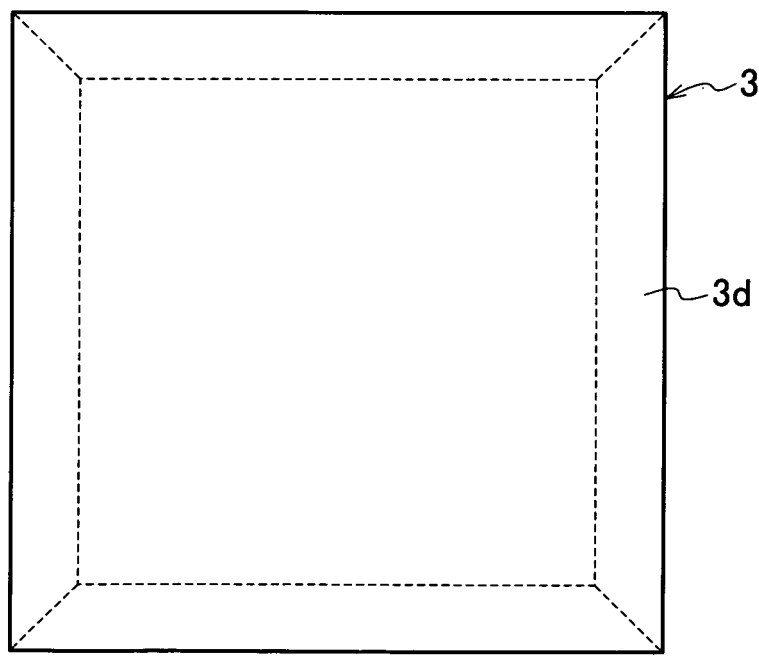

FIG. 4(a) and FIG. 4(b) show a modified example of a light diffusion passive reflector 3 according to the first embodiment. The light diffusion passive reflector 3 is formed as a transparent area 3d which is a transparent part outside from the bottom surface 3b, when observed from the plan surface. Moreover, the surface roughness is increased on the light-emitting surface 3a in order to improve the light diffusing function.

The light diffusion passive reflector 3 according to the modified example becomes advantageous when the gradient is gentle so that the angle of gradient θ of the side surface 3c is not more than 45 degrees. That is, when the gradient of the angle of gradient θ is gentle, the light does not reach to the side surface 3c easily directly from the light emitting region A1 of the surface light source panel 2, and little light diffused within the light diffusion passive reflector 3 just above the light emitting region A1 reaches. In this case, if a part corresponding to the non-light emitting region A2 in the light diffusion passive reflector 3 is cloudy by particles for light diffusion, optical loss becomes large and the non-light emitting region A2 which is an adjoining part between the surface light source panels 2 becomes dark easily. Accordingly, it becomes advantageous since the optical loss decreases by forming such part by the transparent area 3d.

Moreover, as mentioned above, since the surface roughness is increased on the light-emitting surface 3a, the whole light-emitting surface 3a becomes a light diffusing surface, and the boundary between the transparent area 3d in the light-emitting surface 3a of the light diffusion passive reflector 3 and the other part is formed indistinctly, and it can contribute to improvement in luminance in-plane uniformity.

According to the first embodiment, since the light is guided from the light emitting region side and the light is emitted from the direct light-emitting surface 3a, or the light reflected on the side surface 3c is emitted, on the part located on the non-light emitting region (for example, the region in which the sealing member is formed and the peripheral edge part) of the surface light source panel 2 in the light diffusion passive reflector 3, the luminance in-plane uniformity can be improved as whole the lighting device 1. Therefore, according to the first embodiment, the one piece continuous face optically can be formed.

[Second Embodiment]

Hereinafter, a lighting device 10 according to a second embodiment of the present invention will be explained using FIG. 5(a) to FIG. 5(c).

As shown in FIG. 5(a) to FIG. 5(c), the lighting device 10 according the present embodiment is substantially composed by including a plurality of surface light source panels 11, a light diffusion passive reflector 12 which is the same number as the surface light source panel 11 formed on the surface (adverse side) at the each light-emitting side of the surface light source panels 11, a heat sink plate 13 which is the same number as the surface light source panel 11 formed on the backside of the surface light source panel 11, and a universal link 14 for connecting the heat sink plates 13 each other which are mutually adjoining so that curvature is possible.

Since the surface light source panel 11 is the same as that of the surface light source panel 2 according to the above-mentioned first embodiment shown in FIG. 3(a) and FIG. 3(b), the explanation is omitted.

According to the present embodiment, the light-emitting surface 12a of the light diffusion passive reflector 12 is set as larger size than the heat sink plate 13 and the surface light source panel 11. That is, the periphery of the light-emitting surface 12a is set up to be located outside of the outline by the plane view of the heat sink plate 13 and the surface light source panel 11. In addition, other configurations in the light diffusion passive reflector 12 are the same as that of the above-mentioned first embodiment, and have the side surface 12c for functioning as the bottom surface 12b and the reflection mirror.

Moreover, in the present embodiment, the surface light source panel 11 and the light diffusion passive reflector 12 are formed on each of the heat sink plate 13 adjoining mutually and connecting mutually so that curvature is possible, instead of the configuration which disposes and fixes the surface light source panel 11 on the flat surface of the supporting substrate such as the above-mentioned first embodiment.

In this case, the heat sink plates 13 are connected with each other with universal links 14, as shown in FIG. 5(a) to FIG. 5(c). In the universal link 14, a pair of arm units 14a is supported pivotally between ends of one side with an axis of rotation 14b rotatable. Ball parts 14c having spherical surfaces are formed at the free ends of a pair of the arm units 14a. The ball parts 14c are supported by the backside of the heat sink plate 13 rotatable. In addition, in the present embodiment, although the example in which the ball part 14c is embedded under the backside of the heat sink plate 13 rotatable is shown, it may allow to curve along the conic surface etc. except the spherical surface.

According to the present embodiment, the arm unit 14a becomes freely swingable for the backside of the heat sink plate 13 by using the ball part 14c as a fulcrum. By using such a universal link 14, the distance between the heat sink plates 13 can be changed by changing the distance between the ball parts 14c of a pair of the arm units 14a. As a result, a continuous face can be formed in the condition that the light-emitting surfaces 12a of the light diffusion passive reflectors 12 mutually adjoining are mutually curved each other, in the state to contact between the edge parts of the light diffusion passive reflector 12 so that a gap does not occur in between. FIG. 5(a) shows the state where a plurality of light-emitting surfaces 12a forming the continuous face are made curved to become a convex as a whole. FIG. 5(b) shows the state where a plurality of light-emitting surfaces 12a forming the continuous face are calibrated to become a flat surface as a whole. FIG. 5(c) shows the state where a plurality of light-emitting surfaces 12a forming the continuous face are made curved to become a concave as a whole.

In the present embodiment, since the angle can be relatively changed arbitrarily between the adjoining light diffusion passive reflectors 12 of the light-emitting surface 12a which forms the continuous face, it is possible to produce easily the lighting device 10 of shape corresponding to an intended use.

The lighting device 10 according to the present embodiment can also be made into one optically unified light-emitting surface without a connecting part in appearance using a plurality of surface light source panels 11.

When the lighting device 10 according to the present embodiment is used, for example as a decorative sign backlight, it is possible to change it to arbitrary shape corresponding to environment, since it can be disposed inside the cylindrical decorative sign in the condition that the lighting device 10 itself is also made cylindrical. Also in the present embodiment, since the connecting part between the surface light source panels 12 does not become a dark part, it can be made as the lighting having high display quality.

MODIFIED EXAMPLE 1 OF CONNECTING STRUCTURE

Although the second embodiment shows the configuration which connected the heat sink plate 13 each other with the universal link 14, a plurality of base plates 15 for supporting the surface light source panel are prepared in order to connect between the base plate 15 adjoining mutually with the universal link 16, as shown in FIG. 6(a) and FIG. 6(b). Since the universal link 16 shown in FIG. 6(a) and FIG. 6(b) is almost the same about the point that the ball part 16b is supported by the backside of the heat sink plate 13 swingable and other functions except that the shape of the universal link 14 and the arm unit 16a shown in FIG. 5(a) to FIG. 5(c) differs, the detailed explanation is omitted. In addition, in the modified example shown in FIG. 6(a), the universal link 16 is provided in the part where the side of the x direction and y direction shown in FIG. 6(a) by an arrow is mutually adjoining, respectively so that the base plates 15 can be curved each other by a column unit or a row unit.

In the modified example 1, the lighting device having the same function as the above-mentioned second embodiment is achievable by disposing the surface light source panel and the light diffusion passive reflector on the surface of the base plate 15.

MODIFIED EXAMPLE 2 OF CONNECTING STRUCTURE

FIG. 7 and FIG. 8 show a modified example 2 of the connecting structure. The modified example 2 is an example which disposes a plurality of rectangular-shaped electrode plates 17 vertically and horizontally in two dimensions, and connects between the sides adjoining and opposing to the height or width of the electrode plates 17 adjoining mutually via the hinge region 18 so that curvature is possible. As shown in FIG. 7 and FIG. 8, in the modified example 2, the surface light source panel 11 is formed to range over between the electrode plates 17 adjoining mutually without being connected with the hinge region 18. Moreover, as shown in FIG. 7, the heat sink plate 13 is formed to accompany the backside of the electrode plate 17. In addition, in the modified example 2, the surface light source panel 11 is disposed to range over between the electrode plates 17 adjoining mutually, but may be disposed so that the outlines overlaps each other over the front side of the electrode plate 17 mostly.

In the above-mentioned modified example 2 of the connecting structure, the lighting device with which the light-emitting surfaces can be curved mutually is achievable by disposing the same light diffusion passive reflector as the above-mentioned second embodiment on the surface light source panel 11.

According to the above-mentioned second embodiment, since it can suppress that the dark part occurs in the boundary part between the surface light source panels 11 even if the surface light source panel 11 is disposed in two dimensions without limitation of a number, it is possible to build the lighting device 10 which is the optically unified large-sized surface light source.

[Other Embodiments]

The present invention is not to be considered limited to apart of disclosure of the above-mentioned embodiments including associated description and drawings. With the disclosure, artisan might easily think up alternative embodiments, embodiment examples, or application techniques.

For example, in the above-mentioned first and second embodiments, although a plurality of surface light source panels 2 and 11, the heat sink plate 13, the base plate 15, the electrode plate 17, etc. are set to have substantially the same size, it is effective also as a configuration to mix a element from which a vertical and horizontal dimension differs partially. In particular, in the above-mentioned second embodiment, it is also possible to form the continuous face approximated to a curved surface by setting the surface light source panel etc. of the curved part as narrow width.

Moreover, in the above-mentioned first embodiment, although the angle θ between the side surface 3c of the light diffusion passive reflector 3 and the surface of the surface light source panel 2 is set up the range of 45±10 degrees, it is not limited to such configuration. What is necessary is just to set up suitably according to various kinds of conditions of the width dimension and materials etc. of the light diffusion passive reflector 3.

Furthermore, although the above-mentioned first embodiment has explained the example to increase the surface roughness on the light-emitting surface 3a, it may be suitable for a structure to bond the light scattering film on the light-emitting surface 3a mutually.

Moreover, although the above-mentioned second embodiment shows the example to be connected by using the universal links 14 and 16, it is not limited to the universal link if it has a configuration that the adjoining light diffusion passive reflectors can be curved mutually. For example, it is easy to be natural also as a configuration to connect between the elements adjoining mutually with a rubber sheet etc. having elasticity, instead of the universal link.

The invention claimed is:

1. A lighting device comprising:
   a plurality of surface light source panels having an organic electroluminescence layer, an anode, and a cathode disposed to be mutually adjoining in two dimensions, and having a light emitting region and a non-light emitting region; and
   a plurality of light diffusion passive reflectors including a side surface, a light-emitting surface and a bottom surface, the bottom surface being disposed on a surface of the light emitting region in each of the plurality of surface light source panels and formed to cover only the light emitting region of a surface light source panel, the side surface acting as a reflection minor surface formed to incline towards a diagonal outside at a side of a light-emitting direction from the bottom surface, the light-emitting surface emitting an emitted light from the light emitting region and a reflected light from the side surface and having substantially a same size as a planar outline of a surface light source panel,
   wherein a plurality of the light diffusion passive reflectors is disposed to be mutually adjoining without a gap in between and to form a continuous face, and
   wherein a plurality of the surface light source panels are disposed to be mutually adjoining in two dimensions, are provided along with a plurality of electrode plates mutually connected so as to allow each electrode plate to bend with respect to another electrode plate, and can be bent at a boundary part therebetween in synchronization with a bending movement of an electrode plate.

2. The lighting device according to claim 1, wherein a part located outside of an outline at the bottom surface of the light diffusion passive reflector is transparent.

3. A lighting device comprising:
   a plurality of surface light source panels having an organic electroluminescence layer, an anode, and a cathode disposed to be mutually adjoining in two dimensions, and having a light emitting region and a non-light emitting region; and
   a plurality of light diffusion passive reflectors including a side surface, a light-emitting surface, and a bottom surface, the bottom surface being disposed on a surface of the light emitting region in each of the plurality of the surface light source panels and formed to cover only the light emitting region of the surface light source panel, the side surface acting as a reflection minor surface formed to incline towards a diagonal outside at a side of a light-emitting direction from the bottom surface, the light-emitting surface emitting an emitted light from the light emitting region and a reflected light from the side surface and having substantially a same size as a planar outline of a surface light source panel,
   wherein a plurality of the light diffusion passive reflectors is disposed to be mutually adjoining without a gap in between and to form a continuous face, wherein the surface light source panels adjoining mutually are provided so as to allow each surface light source panel to bend with respect to each other,
   wherein the plurality of mutually adjoining surface light source panels are connected with each other by supporting a free end of a pair of universal links rotatably at a backside of the plurality of mutually adjoining surface light source panels, respectively, and edge parts between the plurality of light diffusion passive reflectors can be in abutting contact with each other in a state wherein the plurality of mutually adjoining surface light source panels are bent with respect to each other.

4. The lighting device according to claim 1, wherein the light-emitting surface of the light diffusion passive reflector has light diffusion structure.

5. The lighting device according to claim 3, wherein the light-emitting surface of the plurality of light diffusion passive reflectors has a light diffusion structure.

6. The lighting device according to claim 3, wherein a part located outside of an outline at the bottom surface of the plurality of light diffusion passive reflectors is transparent.

* * * * *